US011349215B2

(12) United States Patent
Kim et al.

(10) Patent No.: US 11,349,215 B2
(45) Date of Patent: May 31, 2022

(54) ANTENNA APPARATUS AND ANTENNA MODULE

(71) Applicant: Samsung Electro-Mechanics Co., Ltd., Suwon-si (KR)

(72) Inventors: Nam Ki Kim, Suwon-si (KR); Ju Hyoung Park, Suwon-si (KR); Jeong Ki Ryoo, Suwon-si (KR); Dae Ki Lim, Suwon-si (KR); Myeong Woo Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 77 days.

(21) Appl. No.: 17/060,319

(22) Filed: Oct. 1, 2020

(65) Prior Publication Data

US 2021/0021039 A1 Jan. 21, 2021

Related U.S. Application Data

(63) Continuation of application No. 16/175,099, filed on Oct. 30, 2018, now Pat. No. 10,833,414.

(30) Foreign Application Priority Data

Mar. 2, 2018 (KR) .................. 10-2018-0025270
Jun. 25, 2018 (KR) .................. 10-2018-0072740

(51) Int. Cl.
*H01Q 1/38* (2006.01)
*H01Q 9/04* (2006.01)
(Continued)

(52) U.S. Cl.
CPC ....... *H01Q 9/045* (2013.01); *H01L 23/49827* (2013.01); *H01L 23/66* (2013.01);
(Continued)

(58) Field of Classification Search
CPC .......... H01Q 1/2283; H01Q 1/22; H01Q 1/38; H01Q 9/04; H01Q 9/0414; H01Q 9/28;
(Continued)

(56) References Cited

U.S. PATENT DOCUMENTS 4,780,724 A   10/1988  Sharma et al.
4,821,040 A *  4/1989  Johnson ............... H01Q 1/3275
                                                343/789

(Continued)

FOREIGN PATENT DOCUMENTS

AU    673976 B2    11/1996
CN   101032055 A    9/2007
(Continued)

OTHER PUBLICATIONS

Chinese Office Action dated Apr. 24, 2020 issued in the corresponding Chinese Patent Application No. 201910068447.5 (12 pages in English, 10 pages in Chinese).

(Continued)

*Primary Examiner* — Tho G Phan
(74) *Attorney, Agent, or Firm* — NSIP Law (57) ABSTRACT

An antenna apparatus includes: a feed via; a patch antenna pattern electrically connected to one end of the feed via; a ground layer disposed in a position vertically lower than a position of the patch antenna pattern, and having a through-hole through which the feed via passes; a first conductive ring pattern laterally spaced apart from the patch antenna pattern, and having a first through region laterally surrounding the patch antenna pattern; and a second conductive ring pattern disposed in a position vertically higher than a position of the first conductive ring pattern, and having a second through region laterally surrounding the patch antenna pattern, wherein an area of the second through region is greater than an area of the first through region.

20 Claims, 9 Drawing Sheets

(51) Int. Cl.
  *H01Q 1/22* (2006.01)
  *H01L 23/498* (2006.01)
  *H01L 23/66* (2006.01)

(52) U.S. Cl.
  CPC ............ *H01Q 1/2283* (2013.01); *H01Q 1/38* (2013.01); *H01Q 9/0414* (2013.01); *H01Q 9/0464* (2013.01)

(58) Field of Classification Search
  CPC ...... H01Q 9/285; H01Q 9/0435; H01Q 9/045; H01Q 9/0464; H01Q 1/24; H01Q 1/243; H01Q 19/24; H01Q 21/06; H01Q 21/065; H01Q 21/28; H01L 23/49; H01L 23/49827; H01L 23/66; H01L 2223/6677; H01L 2224/16225; H01L 23/49822
  See application file for complete search history.

(56) References Cited

U.S. PATENT DOCUMENTS

| | | | |
|---|---|---|---|
| 5,444,452 A | 8/1995 | Itoh et al. | |
| 6,160,522 A | 12/2000 | Sanford | |
| 6,181,279 B1 | 1/2001 | Van Hoozen | |
| 7,812,767 B2 | 10/2010 | Seki et al. | |
| 8,659,498 B2 | 2/2014 | Rothwell et al. | |
| 8,970,435 B2 | 3/2015 | Aboush | |
| 9,184,504 B2 * | 11/2015 | Tatarnikov | H01Q 9/0464 |
| 9,252,499 B2 | 2/2016 | Chen et al. | |
| 9,582,693 B2 | 2/2017 | Yosui et al. | |
| 10,008,783 B2 * | 6/2018 | Ueda | H01Q 21/065 |
| 10,181,646 B2 * | 1/2019 | Celik | H01Q 9/0435 |
| 10,886,618 B2 * | 1/2021 | Kim | H01Q 9/0464 |
| 2008/0042917 A1 | 2/2008 | Seki et al. | |
| 2010/0090903 A1 | 4/2010 | Byun et al. | |
| 2015/0070228 A1 | 3/2015 | Gu et al. | |
| 2015/0070231 A1 | 3/2015 | Park et al. | |
| 2020/0287287 A1 * | 9/2020 | Ying | H01Q 9/0407 |

FOREIGN PATENT DOCUMENTS

| | | |
|---|---|---|
| CN | 202585727 U | 12/2012 |
| EP | 1 796 213 A1 | 6/2007 |
| KR | 10-2007-0033039 A | 3/2007 |
| KR | 10-0702406 B1 | 4/2007 |
| KR | 10-0917847 B1 | 9/2009 |
| KR | 10-1454878 B1 | 11/2014 |
| KR | 10-1810476 B1 | 12/2017 |

OTHER PUBLICATIONS

Korean Office Action dated Apr. 29, 2019 in counterpart Korean Patent Application No. 10-2018-0072740 (6 pages in English and 5 pages in Korean).

* cited by examiner

ANTENNA APPARATUS AND ANTENNA MODULE

CROSS-REFERENCE TO RELATED APPLICATIONS

This application is a continuation of U.S. patent application Ser. No. 16/175,099 filed on Oct. 30, 2018, which claims the benefit under 35 U.S.C. § 119(a) of Korean Patent Application No. 10-2018-0025270 filed on Mar. 2, 2018, and Korean Patent Application No. 10-2018-0072740 filed on Jun. 25, 2018, in the Korean Intellectual Property Office, the entire disclosures of which are incorporated herein by reference for all purposes.

BACKGROUND

1. Field

The following description relates to an antenna apparatus and an antenna module.

2. Description of Related Art

Data traffic of mobile communications is increasing rapidly every year. Technological development is underway to support the transmission of such rapidly increased data in real time in wireless networks. For example, the contents of internet of things (IoT) based data, augmented reality (AR), virtual reality (VR), live VR/AR combined with SNS, autonomous navigation, applications such as Sync View (real-time video transmissions of users using ultra-small cameras), and the like may require communications (e.g., 5G communications, mmWave communications, etc.) supporting the transmission and reception of large amounts of data.

Recently, millimeter wave (mmWave) communications, including 5th generation (5G) communications, have been researched, and research into the commercialization and standardization of an antenna apparatus and module capable of smoothly implementing such communications is progressing.

Since RF signals in high frequency bands (e.g., 24 GHz, 28 GHz, 36 GHz, 39 GHz, 60 GHz, etc.) are easily absorbed and lost in the course of the transmission thereof, the quality of communications may be dramatically reduced. Therefore, antennas for communications in high frequency bands may require approaches that are different from those of conventional antenna technology, and a separate approach may require further special technologies, such as separate power amplifiers for providing antenna gain, integrating an antenna and RFIC, and providing effective isotropic radiated power (EIRP), and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna apparatus includes: a feed via; a patch antenna pattern electrically connected to one end of the feed via; a ground layer disposed in a position vertically lower than a position of the patch antenna pattern, and having a through-hole through which the feed via passes; a first conductive ring pattern laterally spaced apart from the patch antenna pattern, and having a first through region laterally surrounding the patch antenna pattern; and a second conductive ring pattern disposed in a position vertically higher than a position of the first conductive ring pattern, and having a second through region laterally surrounding the patch antenna pattern, wherein an area of the second through region is greater than an area of the first through region.

The antenna apparatus may further include a grounding via disposed to electrically connect the first conductive ring pattern and the ground layer to each other, and arranged to laterally surround the patch antenna pattern.

The antenna apparatus may further include chain vias disposed to electrically connect the first conductive ring pattern and the second conductive ring pattern to each other, and arranged to laterally surround the patch antenna pattern.

The antenna apparatus may further include a third conductive ring pattern disposed between the first conductive ring pattern and the second conductive ring pattern, and having a third through region laterally surrounding the patch antenna pattern, wherein an area of the third through region is greater than an area of the first through region, and is smaller than an area of the second through region.

The antenna apparatus may further include: first chain vias disposed to electrically connect the first conductive ring pattern and the third conductive ring pattern to each other, and arranged to laterally surround the patch antenna pattern; and second chain vias disposed to electrically connect the second conductive ring pattern and the third conductive ring pattern to each other, and arranged to laterally surround the patch antenna pattern, wherein the first chain vias laterally overlap the second chain vias.

An area of an upper surface of the first conductive ring pattern may be greater than an area of an upper surface of the second conductive ring pattern.

The antenna apparatus may further include a coupling patch pattern disposed in a position vertically higher than the position of the patch antenna pattern, and laterally overlapping the patch antenna pattern.

The coupling patch pattern and the second conductive ring pattern may be disposed at a same vertical height, and the patch antenna pattern and the first conductive ring pattern may be disposed at a same vertical height.

An area of an upper surface of the coupling patch pattern may be greater than an area of an upper surface of the patch antenna pattern, and a shortest distance between the coupling patch pattern and the second conductive ring pattern may be longer than a shortest distance between the patch antenna pattern and the first conductive ring pattern.

An angle of a virtual line connecting a boundary of the first conductive ring pattern and a boundary of the second conductive ring pattern with respect to a vertical direction may be greater than or equal to 20 degrees and less than or equal to 30 degrees.

In another general aspect, an antenna module includes: feed vias; patch antenna patterns respectively electrically connected to ends of corresponding feed vias among the feed vias; a ground layer disposed in a position vertically lower than a position of the patch antenna patterns, and having through-holes through which the feed vias pass; a first conductive porous plate pattern disposed in a position vertically higher than the position of the ground layer, and having first through regions laterally surrounding the patch antenna patterns; and a second conductive porous plate pattern disposed in a position vertically higher than the position of the first conductive porous plate pattern, and having second through regions laterally surrounding the patch antenna patterns, wherein a total area of the second through regions is greater than a total area of the first through regions.

The antenna module may further include: coupling patch patterns disposed in a position vertically higher than the position of the corresponding patch antenna patterns among the patch antenna patterns, and laterally overlapping the patch antenna patterns, wherein a total area of the coupling patch patterns is greater than a total area of the patch antenna patterns.

The antenna module may further include: first feed lines disposed in a position vertically lower than the position of the ground layer, and respectively electrically connected to other ends of corresponding feed vias among the feed vias; first wiring vias disposed in a position vertically lower than the position of the ground layer, and respectively electrically connected to the first feed lines; and an IC disposed in a position vertically lower than the position of the ground layer, and electrically connected to the first wiring vias.

The antenna module may further include: second wiring vias disposed in a position vertically lower than the position of the ground layer, and respectively electrically connected to the IC; second feed lines disposed in a position vertically lower than the position of the ground layer, and respectively electrically connected to corresponding second wiring vias among the second wiring vias; and end-fire antennas electrically connected to corresponding second feed lines among the second feed lines.

The antenna module may further include: a second ground layer disposed in a position vertically lower than the positions of the first and second feed lines, and vertically higher than a position of the IC, wherein the second ground layer has through-holes through which the first and second wiring vias pass, and is electrically connected to the ground layer.

The antenna module may further include: a chain via disposed to electrically connect the first conductive porous plate pattern and the second conductive porous plate pattern to each other; a grounding via disposed to electrically connect the first conductive porous plate pattern and the ground layer to each other; and a shield member disposed in a position vertically lower than a position of the second ground layer, electrically connected to the second ground layer and the ground layer, and disposed to surround the IC.

In another general aspect, an antenna apparatus includes: a core; a feed via disposed in the core; a patch antenna pattern disposed on a first surface of the core and electrically connected to the feed via; a ground layer disposed on a second surface of the core opposite the first surface of the core, and defining a through-hole through which the feed via passes; a first conductive ring pattern disposed on the first surface of the core and defining a first open space surrounding the patch antenna pattern in directions parallel to the first surface of the core; and a second conductive ring pattern disposed in a position spaced apart from the first conductive ring pattern in a direction perpendicular to the first surface of the core, and defining a second open space surrounding the patch antenna pattern in the directions parallel to the first surface of the core, wherein an area of the second open space is greater than an area of the first open space.

An area of a surface of the first conductive ring pattern may be greater than an area of a surface of the second conductive ring pattern.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
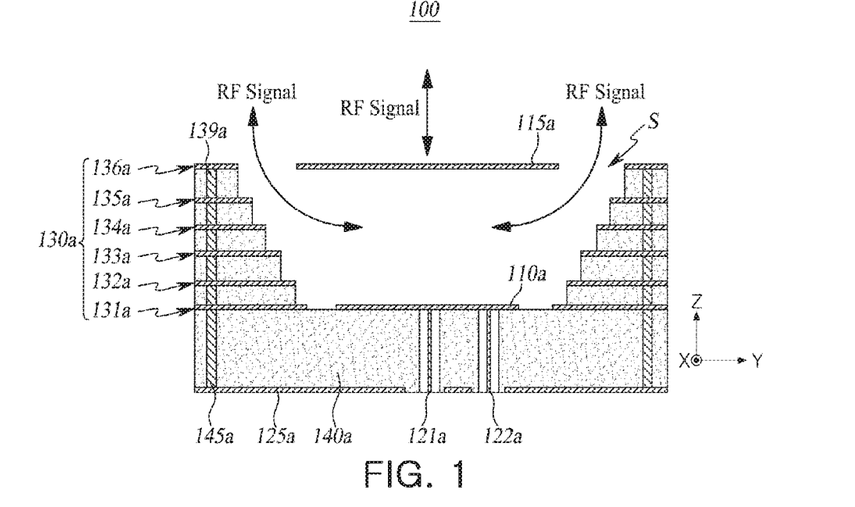
FIG. 1 is a side view illustrating an antenna apparatus, according to an embodiment.

FIG. 1 is a side view illustrating an antenna apparatus 100, according to an embodiment of the present disclosure.

Referring to FIG. 1, an antenna apparatus 100 may include a patch antenna pattern 110a, feed vias 121a and 122a, and a conductive ring pattern 130a. The conductive ring pattern 130a may include at least a portion of a first conductive ring pattern 131a, a second conductive ring pattern 136a, a third conductive ring pattern 132a, a fourth conductive ring pattern 133a, a fifth conductive ring pattern 134a, and a sixth conductive ring pattern 135a.

The patch antenna pattern 110a and the conductive ring pattern 130a may be disposed on a first surface of a core region 140a extending in a lateral plane (e.g., an XY plane/X and Y directions).

The feed vias 121a and 122a may be configured to pass a radio frequency (RF) signal. For example, the feed vias 121a and 122a may electrically connect an IC and the patch antenna pattern 110a, and may have a structure extending in a Z direction that is perpendicular to an XY plane. That is, the feed vias 121a and 122a may extend through the core region 140a in the Z direction.

The patch antenna pattern 110a may be respectively electrically connected to each of first ends of the feed vias 121a and 122a. The patch antenna pattern 110a may receive the RF signal from the feed vias 121a and 122a, and transmit the RF signal in the Z direction, and may transfer the RF signal received in the Z direction to the feed vias 121a and 122a.

The core region 140a may be provided between the patch antenna pattern 110a and a ground layer 125a, and may separate the patch antenna pattern 110a from the ground layer 125a. That is, the ground layer 125a may be disposed on a second surface of the core region that is opposite to the first surface of the core region 140a on which the patch antenna pattern 110a is disposed. For example, the core region 140a may be filled with an insulating layer.

A portion of the RF signals passed through the patch antenna pattern 110a may be directed to the ground layer 125a disposed in a position lower than a position of the patch antenna pattern 110a. An RF signal directed to the ground layer 125a may be reflected in the ground layer 125a, and may be directed in the Z direction. Therefore, the RF signal passed through the patch antenna pattern 110a may be further concentrated in the Z direction.

For example, the patch antenna pattern 110a may have a structure of a patch antenna having both sides of a circular or polygonal shape. Both sides of the patch antenna pattern 110a may act as a boundary through which the RF signal passes between a conductor and a non-conductor. The patch antenna pattern 110a may have an intrinsic frequency band (e.g., 28 GHz) due to intrinsic factors (e.g., shape, size, height, dielectric constant of the insulating layer, etc.).

The conductive ring pattern 130a may be spaced apart from the patch antenna pattern 110a, and may have a through region S surrounding the patch antenna pattern 110a in the X direction and the Y direction. That is, the conductive ring pattern 130a may define a vertically extending, open space surrounding the patch antenna pattern 110a in the X direction and the Y direction (e.g., directions of the first surface of the core region 140a, or in an XY plane).

The conductive ring pattern 130a may be electromagnetically coupled to the patch antenna pattern 110a, and may provide a capacitance between the conductive ring pattern 130a and the patch antenna pattern 110a.

Configuration and structural factors (e.g., height, shape, size, number, interval, spacing distance to a patch antenna pattern, etc.) of the conductive ring pattern 130a may affect the frequency characteristics of the patch antenna pattern 110a.

The first conductive ring pattern 131a may be spaced apart from the patch antenna pattern 110a in lateral direction(s) (e.g., the X direction and/or the Y direction), and may have a first through region surrounding the patch antenna pattern 110a in the X direction and the Y direction. That is, the first conductive ring pattern 131a may define a first open space surrounding the patch antenna pattern 110a in the X direction and the Y direction.

The second conductive ring pattern 136a may be disposed in a position higher (in the Z direction) than a position of the first conductive ring pattern 131a, and may have a second through region surrounding the patch antenna pattern 110a in the X direction and the Y direction. That is, the second conductive ring pattern 136a may define a second open space surrounding the patch antenna pattern 110a in the X direction and the Y direction.

The third to sixth conductive ring patterns 132a, 133a, 134a, and 135a may be disposed in a position higher or lower than a position of the first and second conductive ring patterns 131a and 136a, respectively, and may have corresponding through regions among third to sixth through regions. That is, the third to sixth conductive ring patterns 132a, 133a, 134a, and 135a may respectively define third to sixth open spaces surrounding the patch antenna pattern 110a in the X direction and the Y direction. One or more of the third to sixth conductive ring patterns 132a, 133a, 134a, and 135a may be omitted, depending on a desired design.

In this case, an area of the second through region may be greater than an area of the first through region. When the conductive ring pattern 130a includes the third to sixth conductive ring patterns 132a, 133a, 134a, and 135a, respective areas of the third to sixth through regions are each greater than an area of the first through region, but are each smaller than an area of the second through region. For example, the conductive ring pattern 130a may have a structure similar to a corrugated waveguide.

Therefore, the RF signal passed through the patch antenna pattern 110a may be further guided in the Z direction, such that gain of the patch antenna pattern 110a may be improved. For example, the antenna apparatus 100 may improve antenna performance even without having an increased size in comparison to a conventional antenna apparatus.

In addition, in comparison to a conventional antenna apparatus, the antenna apparatus 100 may reduce a phase distortion error due to a difference in path of the main beam of the patch antenna pattern 110a, and may reduce high order mode back propagation of the RF signal, by utilizing the corrugated side boundary of the conductive ring pattern 130a.

Referring to FIG. 1, the antenna apparatus 100 may further include a chain vias 139a disposed to electrically connect between the first conductive ring pattern 131a and the second conductive ring pattern 136a, and arranged to surround the patch antenna pattern 110a in the X and Y directions.

An area of an upper surface of the first conductive ring pattern 131a may be greater than an area of an upper surface of the second conductive ring pattern 136a, due to a difference in size between the first and second through regions, and the chain vias 139a.

The chain vias 139a may prevent RF signals passed through the patch antenna pattern 110a from leaking in lateral direction(s) (e.g., the X direction and/or the Y direction).

When the conductive ring pattern 130a includes the third to sixth conductive ring patterns 132a, 133a, 134a, and 135a, the chain vias 139a may include multiple first to fifth chain vias. For example, the first chain vias may be disposed to electrically connect the first conductive ring pattern 131a and the third conductive ring pattern 132a to each other, and the second chain vias may be disposed to electrically connect the second conductive ring pattern 132a and the third conductive ring pattern 132a to each other. In this case, the first to fifth chain vias may overlap each other, in the lateral directions (the X direction and the Y direction). Therefore, spaces between the first to sixth conductive ring patterns 131a, 136a, 132a, 133a, 134a, and 135a may have different sizes from each other.

A portion of RF signals passed through the patch antenna pattern 110a may be reflected in the first and/or the second conductive ring patterns 131a and 136a. The chain vias 139a may reflect an RF signal reflected in the first and/or second conductive ring patterns 131a and 136a. An RF signal reflected in the chain vias 139a may be directed in the Z direction or to the ground layer 125a. An RF signal directed to the ground layer 125a may be reflected in the ground layer 125a, and may be directed in the Z direction. Therefore, the chain vias 139a may further concentrate an RF signal passed through the patch antenna pattern 110a in the Z direction.

Still referring to FIG. 1, the antenna apparatus 100 may further include a grounding via 145a disposed to electrically connect the first conductive ring pattern 131a and the ground layer 125a to each other, and arranged to surround the patch antenna pattern 110a in the X direction and/or the Y direction. Therefore, the conductive ring pattern 130a and the chain vias 139a may more efficiently guide an RF signal passed through the patch antenna pattern 110a in the Z direction.

Still referring to FIG. 1, the antenna apparatus 100 may further include a coupling patch pattern 115a disposed in a position higher than a position of the patch antenna pattern 110a, and overlapping the patch antenna pattern 110a in the X direction and/or the Y direction. Therefore, the antenna apparatus 100 may have a relatively wide bandwidth.

The coupling patch pattern 115a and the second conductive ring pattern 136a may be disposed at a same height in the Z direction. The patch antenna pattern 110a and the first conductive ring pattern 131a may be disposed at a same height in the Z direction. Therefore, the first and second conductive ring patterns 131a and 136a may more effectively concentrate an RF signal passed through the patch antenna pattern 110a in the Z direction.

Figure 2A:
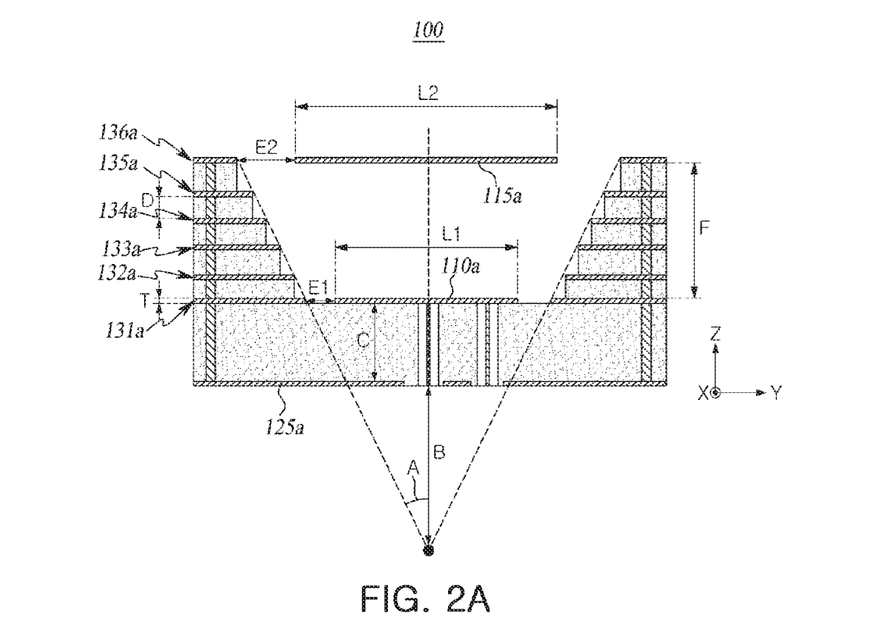
FIG. 2A is a side view illustrating dimensions and positional relationship of the antenna apparatus of FIG. 1, according to an embodiment.

FIG. 2A is a side view illustrating dimensions and positional relationship of the antenna apparatus 100, according to an embodiment.

Referring to FIG. 2A, an angle A of a virtual line connecting a boundary of the first conductive ring pattern 131a and a boundary of a second conductive ring pattern 136a with respect to the vertical direction (e.g., the Z direction) may be greater than or equal to 20 degrees and less than or equal to 30 degrees. Therefore, an antenna apparatus 100 may further concentrate an RF signal passed through the patch antenna pattern in the Z direction.

In addition, the antenna apparatus 100 may have various adjusted angles, in addition to the range of 20 degrees or more and 30 degrees or less, and may have thus various electric field characteristics.

A first distance B from a point, at which lines connecting a boundary of the first conductive ring pattern 131a and a boundary of the second conductive ring pattern 136a intersect, to the ground layer 125a, may be longer than a second distance C from the ground layer 125a to the patch antenna pattern 110a. Therefore, the RF signal passed through the patch antenna pattern 110a may be further concentrated in the Z direction.

A third distance D between adjacent/conductive ring members among the first to sixth conductive ring patterns 131a to 136a may be shorter than a fourth distance E1 between the first conductive ring pattern 131a and the patch antenna pattern 110a, and may be shorter than a fifth distance E2 between the second conductive ring pattern 136a and the coupling patch pattern 115a. Therefore, the RF signal passed through the patch antenna pattern 110a may be further concentrated in the Z direction.

An area L2 of an upper surface of the coupling patch pattern 115a may be greater than an area L1 of an upper surface of the patch antenna pattern 110a, and the fourth distance E1 may be shorter than the fifth distance E2. Therefore, the RF signal passed through the patch antenna pattern 110a may be further concentrated in the Z direction.

Figure 2B:
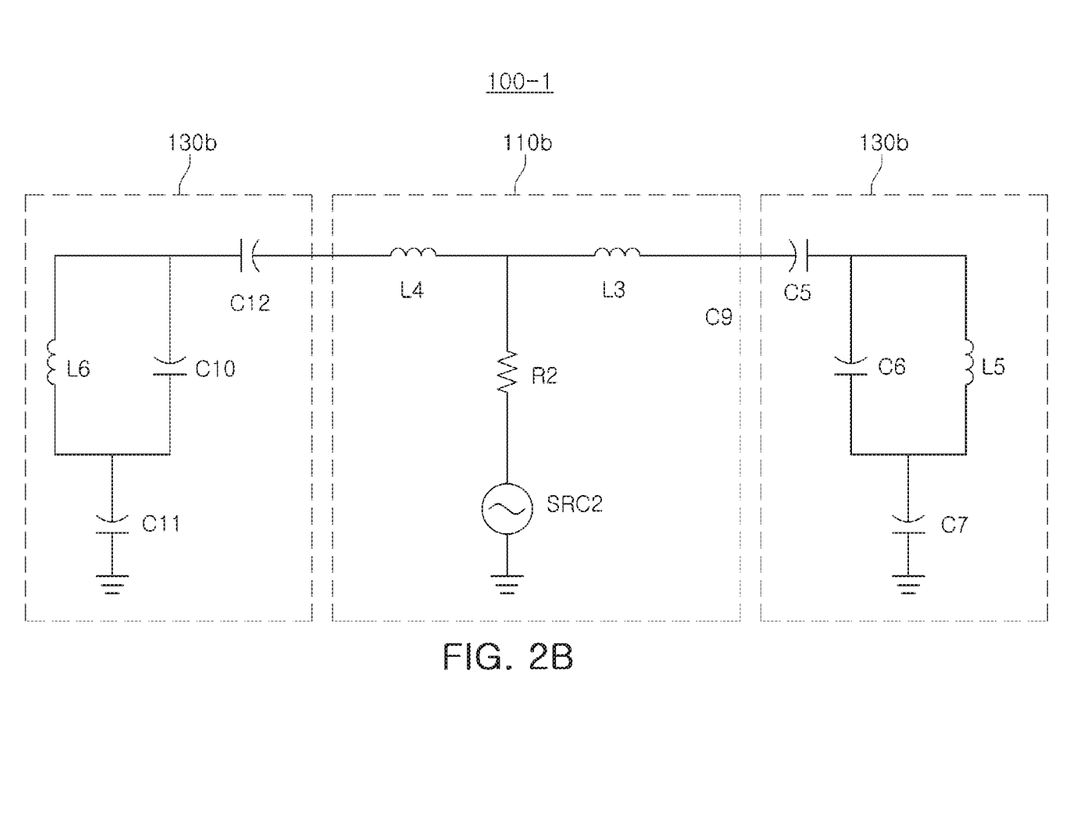
FIG. 2B is a diagram illustrating an equivalent circuit of an antenna apparatus, according to an embodiment.

FIG. 2B is a diagram illustrating an equivalent circuit of an antenna apparatus 100-1, according to an embodiment.

Referring to FIG. 2B, a patch antenna pattern 110b of the antenna apparatus 10b may transmit an RF signal to or receive an RF signal from a source SRC2 such as an IC, and may have resistance value R2 and inductances L3 and L4.

A conductive ring pattern 130b may have capacitances C5 and C12 for the patch antenna pattern 110b, capacitances C6 and 010 between adjacent conductive ring patterns (e.g., conductive ring patterns 131a to 136a of FIG. 1) of the conductive ring pattern 130b, inductances L5 and L6 of chain vias (e.g., chain vias 139a of FIG. 1), and capacitances C7 and 011 between conductive ring patterns and ground layers (e.g., ground layer 125a in FIG. 1).

A frequency band and a bandwidth of the antenna apparatus 100-1 may be determined by the above-described resistance value, capacitance, and inductance.

Figure 3:
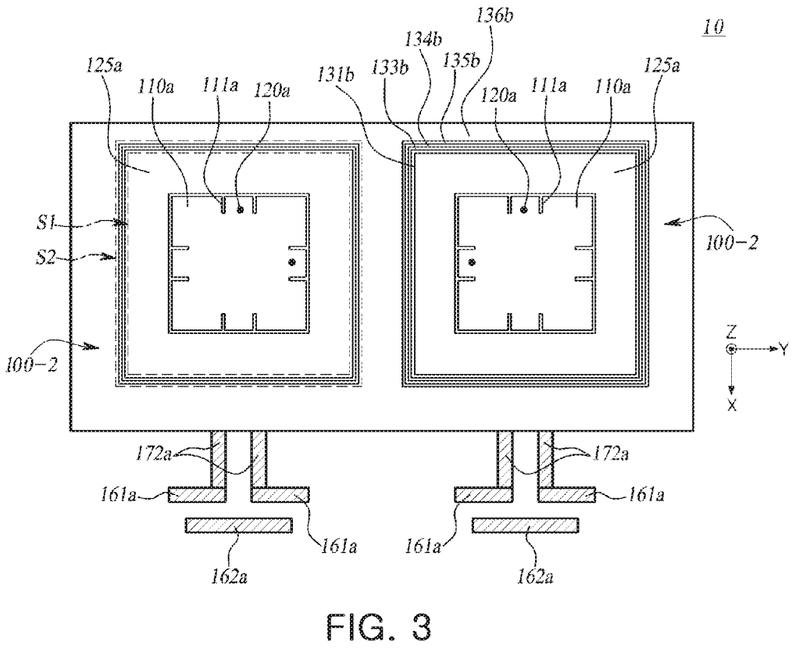
FIG. 3 is a plan view illustrating an antenna module including an antenna apparatus, according to an embodiment.

FIG. 3 is a plan view illustrating an antenna module 10 including an antenna apparatus 100-2, according to an embodiment.

Referring to FIG. 3, the antenna module 10 may further include end-fire antennas including an end-fire antenna pattern 161a, a director pattern 162a, and a second feed line 172a.

The end-fire antenna pattern 161a may form a radiation pattern in a second direction (e.g., the X direction) to transmit or receive an RF signal in the second direction (e.g., the X direction). Therefore, the antenna module 10 may expand an RF signal transmitting/receiving direction omnidirectionally.

For example, the end-fire antenna pattern 161a may have a form of a dipole or a folded dipole. In this example, one end of each pole of the end-fire antenna pattern 161a may be electrically connected to the second feed line 172a. A frequency band of the end-fire antenna pattern 161a may be designed to be substantially equal to a frequency band of the patch antenna pattern 110a, but is not limited to being substantially equal to the frequency band of the patch antenna pattern 110a.

The director pattern 162a may be electromagnetically coupled to the end-fire antenna pattern 161a to improve gain or bandwidth of the end-fire antenna pattern 161a.

The second feed line 172a may transfer an RF signal received from the end-fire antenna pattern 161a to the IC, and may transfer an RF signal received from the IC to the end-fire antenna pattern 161a.

Referring to FIG. 3, the antenna module 10 may include a first conductive porous plate pattern 131b disposed in a position higher than a position of the ground layer 125a, and having first through regions S1 surrounding the patch antenna pattern 110a, respectively, in a lateral plane (e.g., an XY plane); and a second conductive porous plate pattern 136b disposed in a position higher than a position of the first conductive porous plate pattern 131b, and having second through regions S2 surrounding the patch antenna pattern 110a, respectively, in a lateral plane (e.g., an XY plane).

Depending on a desired design, the antenna module 10 may further include third to fifth conductive porous plate patterns 133b, 134b, and 135b arranged between the first conductive porous plate pattern 131b and the second conductive porous plate pattern 136b, and having third to fifth through regions, respectively.

The total area of the second through regions S2 may be greater than the total area of the first through regions S1. When the antenna module 10 further includes the third to fifth conductive porous plate patterns 133b, 134b, and 135b, the total area of the third to fifth through regions may be smaller than the total area of the second through regions S2, but may be greater than the total area of the first through regions S1.

For example, the first to fifth conductive porous plate patterns 131b, 136b, 133b, 134b, and 135b may have a structure similar to a corrugated waveguide. Therefore, the RF signal passed through the patch antenna patterns 110a may be further concentrated in the Z direction.

The patch antenna pattern 110a may include slits 111a formed on both sides of the connection position of the feed via 120a. Therefore, an impedance of the patch antenna pattern 110a may be optimized.

Figure 4:
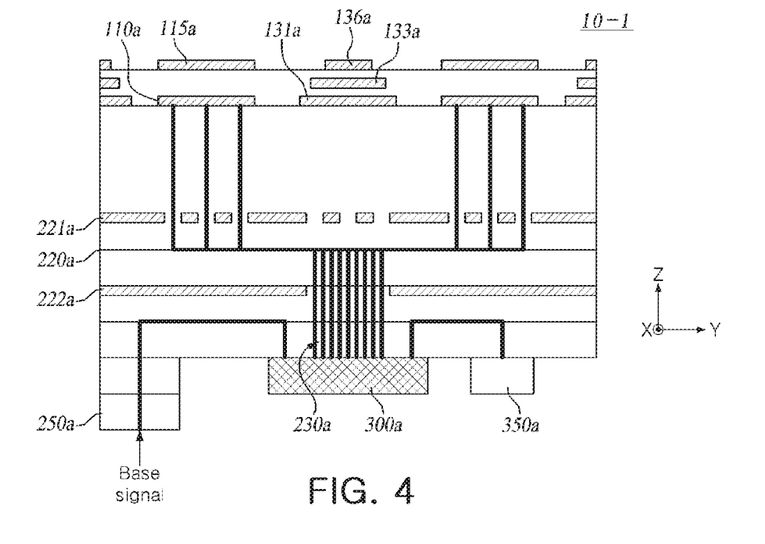
FIG. 4 is a side view illustrating an antenna module, according to an embodiment.

FIG. 4 is a side view illustrating an antenna module 10-1, according to an embodiment.

Referring to FIG. 4, a ground layer 221a may be disposed in a position lower than a position of a patch antenna pattern 110a, a wiring ground layer 220a may be disposed in a position lower than a position of the ground layer 221a, and a second ground layer 222a may be disposed in a position lower than a position of the wiring ground layer 220a.

An IC 300a may be disposed in a position lower than a position of the second ground layer 222a, and may be electrically connected to a wiring via 230a.

A passive component 350a and a sub-substrate 250a may be arranged in a position lower than a position of the second ground layer 222a, and may be electrically connected to the IC 300a.

Since the ground layer 221a, the wiring ground layer 220a, and the second ground layer 222a have a greater area than the patch antenna pattern 110a, the antenna module 10-1 may not additionally cause substantial increase in size, although first and second conductive ring patterns 131a and 136a are further included therein. Therefore, the antenna module 10-1 may improve the antenna performance even without substantially increasing the size.

FIGS. 5A to 5D are plan views illustrating respective layers of an antenna module, according to an embodiment.

Figure 5A:
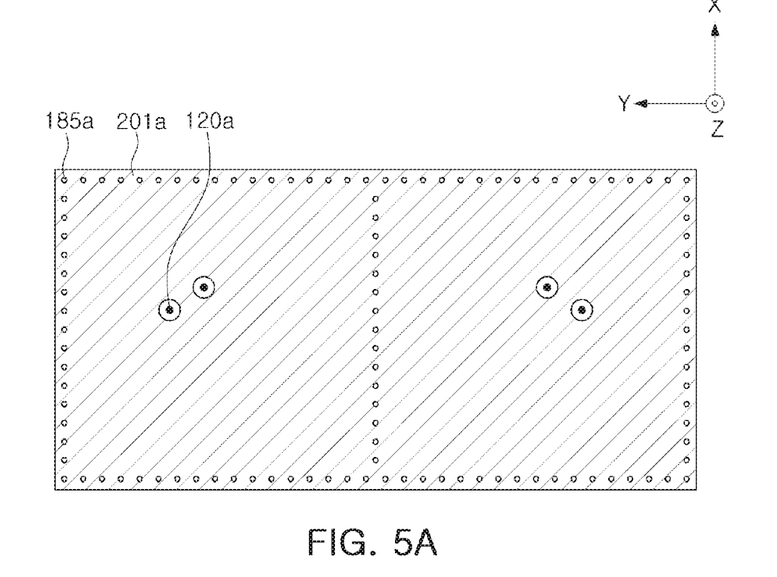
FIGS. 5A to 5D are plan views illustrating respective layers of an antenna module, according to an embodiment.

Referring to FIG. 5A, a ground layer 201a may have a through-hole through which feed vias 121a and 122a pass, and may be connected to the other end of a grounding via 185a. The ground layer 201a may electromagnetically shield between a patch antenna pattern and a feed line.

Figure 5B:
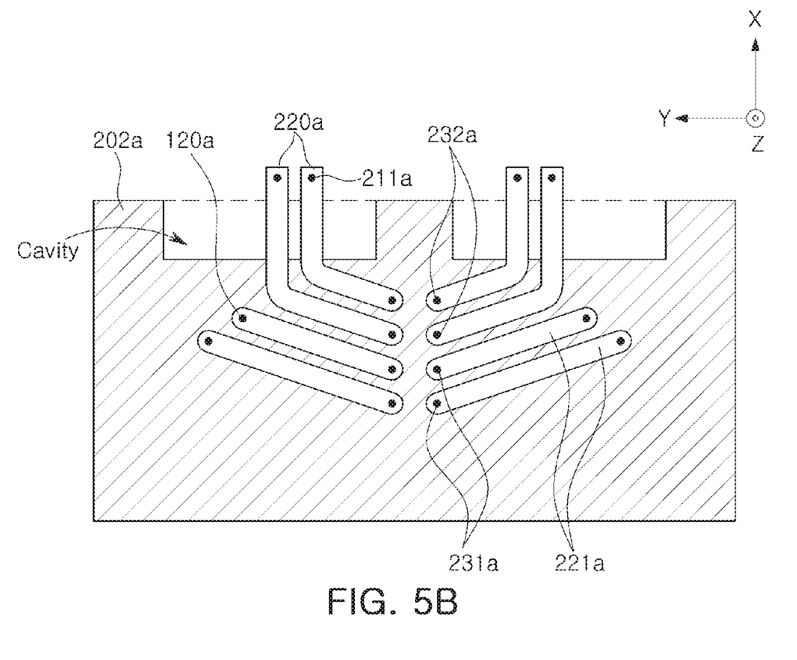

Referring to FIG. 5B, a wiring ground layer 202a may surround at least a portion of a second feed line 220a, and a first feed line 221a, respectively. The second feed line 220a may be electrically connected to the second wiring via 232a, and the first feed line 221a may be electrically connected to the first wiring via 231a. The wiring ground layer 202a may electromagnetically shield between the second feed line 220a and the first feed line 221a. One end of the second feed line 220a may be connected to a second feed via 211a.

Figure 5C:
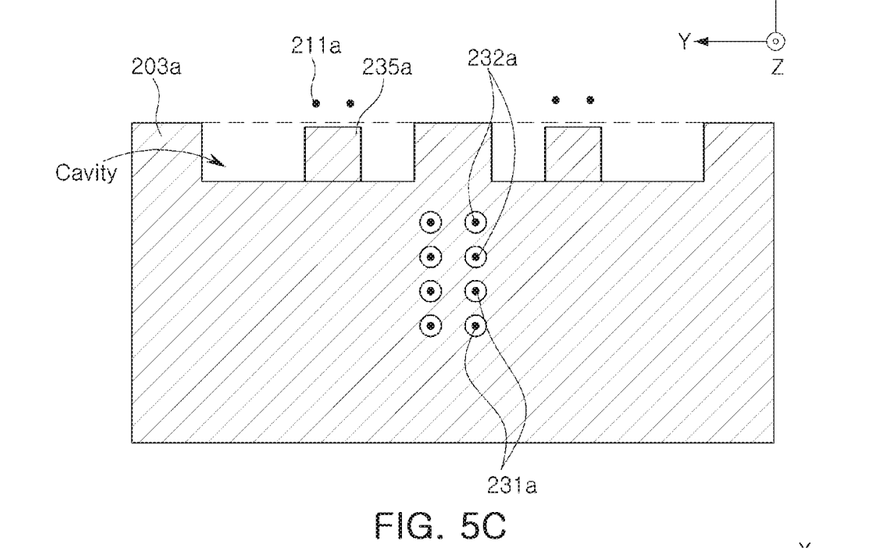

Referring to FIG. 5C, a second ground layer 203a may have through-holes through which a first wiring via 231a and a second wiring via 232a pass, respectively, and may have a coupling ground pattern 235a. The second ground layer 203a may electromagnetically shield between a feed line and an IC.

Figure 5D:
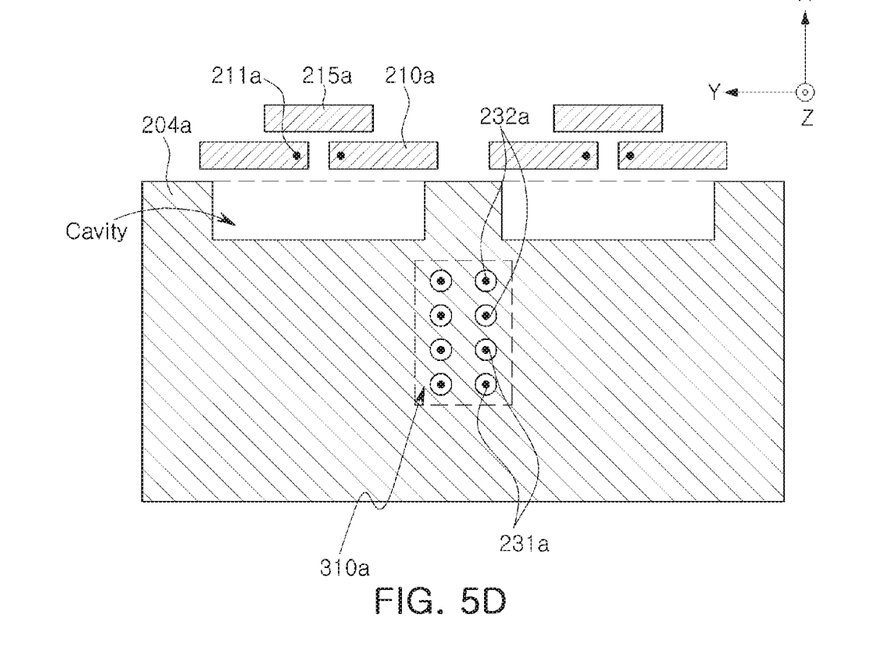

Referring to FIG. 5D, an IC ground layer 204a may have through-holes through which a first wiring via 231a and a second wiring via 232a pass, respectively. An IC 310a may be disposed in a position lower than a position of the IC ground layer 204a, and may be electrically connected to the first wiring via 231a and the second wiring via 232a. An end-fire antenna pattern 210a and a director pattern 215a may be arranged at substantially the same height as the IC ground layer 204a.

The IC ground layer 204a may provide a ground used in circuitry of the IC 310a and/or passive components as the IC 310a and/or the passive components. Depending on a design, the IC ground layer 204a may provide a delivery path of power and signal used in the IC 310a and/or the passive components. Thus, the IC ground layer 204a may be electrically connected to the IC and/or the passive components.

A wiring ground layer 202a, a second ground layer 203a, and the IC ground layer 204a may have a recessed shape to provide a cavity. Therefore, the end-fire antenna pattern 210a may be disposed closer to the IC ground layer 204a.

The vertical relationship and shape of the wiring ground layer 202a, the second ground layer 203a, and the IC ground layer 204a may vary depending on a desired design.

Figure 6A:
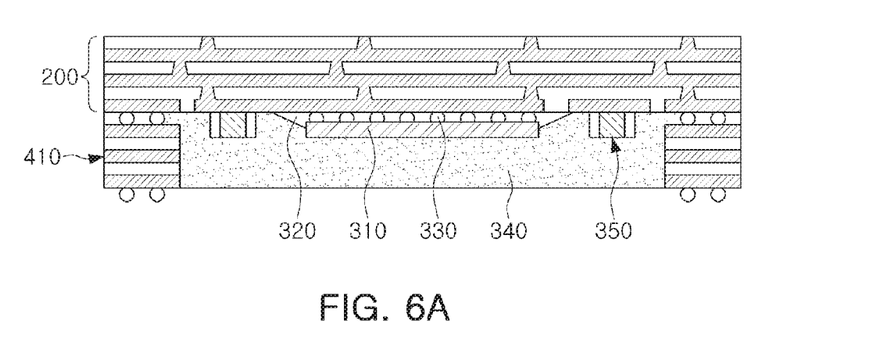
FIGS. 6A and 6B are views illustrating an IC peripheral structure of an antenna module, according to an embodiment.
Figure 6B:
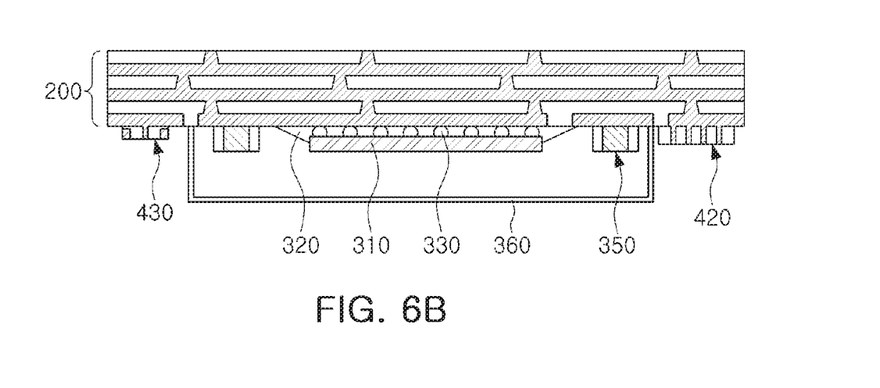

FIGS. 6A and 6B are views illustrating an IC peripheral structure of an antenna module, according to an embodiment.

Referring to FIG. 6A, an antenna module, according to an embodiment, may include at least a portion of a connection member 200, an IC 310, an adhesive member 320, an electrical connection structure 330, an encapsulant 340, a passive component 350, and a sub-substrate 410.

The connection member 200 may include at least a portion of the ground layer, the wiring ground layer, the second ground layer, and the IC ground layer, described above with reference to FIGS. 4 and 5A to 5D.

The IC 310 may be the same as the IC described above, and may be disposed in a position lower than a position of the connection member 200. The IC 310 may be electrically connected to the wiring of the connection member 200 to transmit or receive an RF signal, and may be electrically connected to the ground layer of the connection member 200 to receive a ground. For example, the IC 310 may perform at least a portion of frequency conversion, amplification, filtering, phase control, and power generation to generate a converted signal.

The adhesive member 320 may bond the IC 310 and the connection member 200 to each other.

The electrical connection structure 330 may electrically connect the IC 310 and the connection member 200 to each other. For example, the electrical connection structure 330 may have a structure such as a solder ball, a pin, a land, or a pad. The electrical connection structure 330 may have a melting point lower than that of the wiring and the ground layer of the connection member 200, such that the IC 310 and the connection member 200 may be electrically connected through a predetermined process using the low melting point.

The encapsulant 340 may encapsulate at least a portion of the IC 310, and improve the heat radiation performance and the shock protection performance of the IC 310. For example, the encapsulant 340 may be implemented with a photo-imagable encapsulant (PIE), Ajinomoto build-up film (ABF), epoxy molding compound (EMC), or the like.

The passive component 350 may be disposed on the lower surface of the connection member 200, and may be electrically connected to the wiring and/or ground layer of the connection member 200 through the electrical connection structure 330. For example, the passive component 350 may include at least a portion of a capacitor (e.g., a multilayer ceramic capacitor (MLCC)), an inductor, or a chip resistor.

The sub-substrate 410 may be disposed in a position lower than a position of the connection member 200, and may be electrically connected to the connection member 200 to receive an intermediate frequency (IF) signal or a baseband signal from the outside and transmit the signal to the IC 310, or receive an IF signal or a baseband signal from the IC 310 and transmit the signal to the outside. In this case, a frequency of the RF signal (for example, 24 GHz, 28 GHz, 36 GHz, 39 GHz, and 60 GHz) may be higher than a frequency of the IF signal (for example, 2 GHz, 5 GHz and 10 GHz).

For example, the sub-board 410 may transmit an IF signal or a baseband signal to the IC 310, or may receive the signal from the IC 310 through a wiring that may be included in the IC ground layer of the connection member 200. Since the first ground layer of the connection member 200 is disposed between the IC ground layer and the wiring, the IF signal or the baseband signal and the RF signal may be electrically isolated in the antenna module.

Referring to FIG. 6B, an antenna module, according to an embodiment, may include at least a portion of a shield member 360, a connector 420, and a chip antenna 430.

The shield member 360 may be disposed in a position lower than a position of a connection member 200, and may be disposed to confine the IC 310 in association with the connection member 200. For example, the shield member 360 may be arranged to cover (e.g., conformably shield) the IC 310 and the passive components 350 together, or cover (e.g., compartmentally shield) the IC 310 and the passive components 350, respectively. For example, the shield member 360 may have a hexahedral shape with one surface open, and may have a receiving space of a hexahedron through coupling with the connection member 200. The shield member 360 may be formed of a material having high conductivity such as copper to have a relatively shallow skin depth, and may be electrically connected to the ground layer of the connection member 200. Therefore, the shield member 360 may reduce the electromagnetic noise from which the IC 310 and the passive component 350 may receive.

The connector 420 may have a connection structure of a cable (e.g., a coaxial cable, a flexible PCB), may be electrically connected to the IC ground layer of the connection member 200, and may serve a purpose similar to that the above described sub-substrate 410 in FIG. 6A. For example, the connector 420 may be provided with an IF signal, a baseband signal, and/or power from the cable, or may provide an IF signal and/or a baseband signal to the cable.

The chip antenna 430 may transmit or receive an RF signal to assist the antenna apparatus, according to an embodiment. For example, the chip antenna 430 may include a dielectric block having a dielectric constant greater than that of the insulating layer, and electrodes disposed on both surfaces of the dielectric block. One of the electrodes may be electrically connected to the wiring of the connection member 200, and the other of the electrodes may be electrically connected to the ground layer of the connection member 200.

Figure 7:
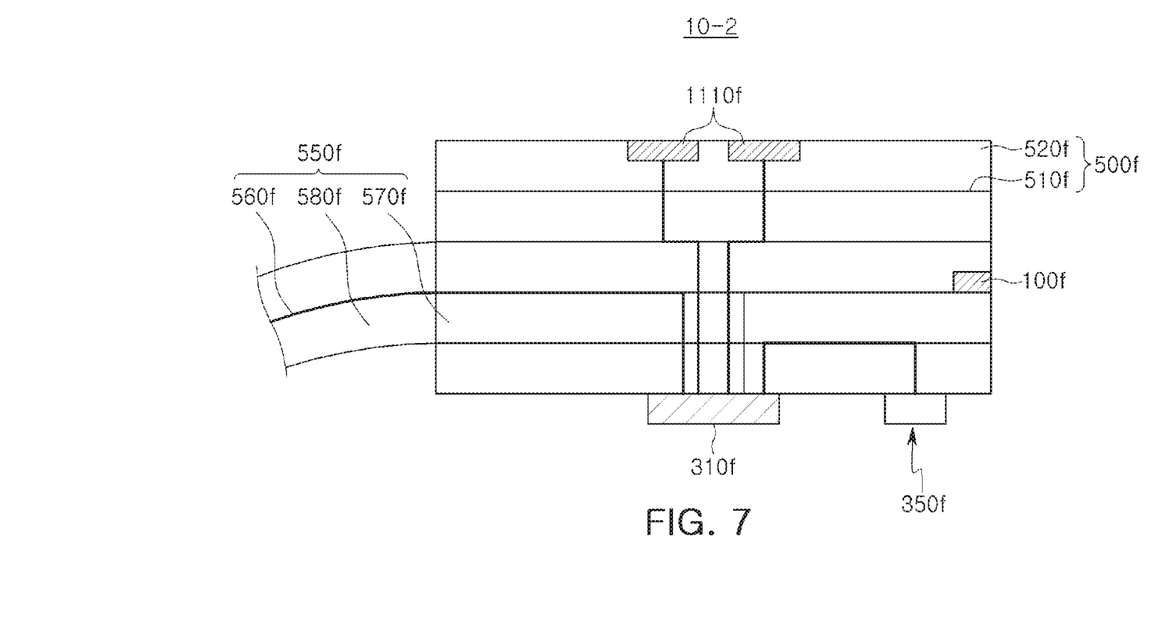
FIG. 7 is a side view illustrating a structure of an antenna apparatus and an antenna module, according to an embodiment.

FIG. 7 is a side view illustrating a structure of an antenna apparatus and an antenna module, according to an embodiment.

Referring to FIG. 7, an antenna module 10-2, according to an embodiment, may have a structure in which an end-fire antenna 100f, a patch antenna pattern 1110f, an IC 310f, and a passive component 350f are integrated into a connection member 500f.

The end-fire antenna 100f and the patch antenna pattern 1110f may be designed in the same manner as the above-described antenna apparatus and the above-described patch antenna pattern, respectively, and may receive the RF signal from the IC 310f, and transmit the RF signal, and may transfer the RF signal received to the IC 310f.

The connection member 500f may have a structure in which at least one conductive layer 510f and at least one insulating layer 520f are stacked (for example, a structure of a printed circuit board). The conductive layer 510f may have a ground layer and a feed line as described above.

In addition, the antenna module 10-2 may further include a flexible connection member 550f. The flexible connection member 550f may include a first flexible region 570f overlapping the connection member 500f, and a second flexible region 580f not overlapping the connection member 500f, in a lateral direction (e.g., the Y direction).

The second flexible region 580f may be flexibly bent in a vertical direction. Therefore, the second flexible region 580f may be flexibly connected to a connector of a set substrate and/or an adjacent antenna module.

The flexible connection member 550f may include a signal line 560f. Intermediate frequency (IF) signals and/or baseband signals may be transferred to IC 310f through signal line 560f, or may be transferred to a connector and/or an adjacent antenna module of a set substrate.

Figure 8A:
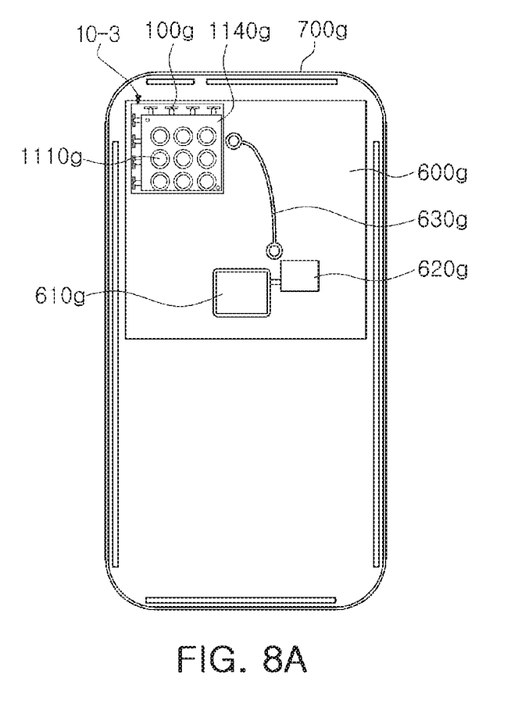
FIGS. 8A and 8B are plan views illustrating arrangements of an antenna modules in electronic devices, according to embodiments.
Figure 8B:
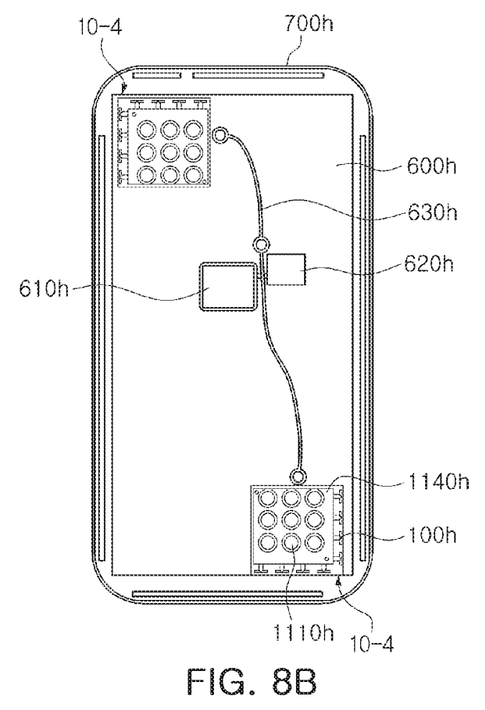

FIGS. 8A and 8B are plan views illustrating arrangements of antenna modules in electronic devices, according to embodiments.

Referring to FIG. 8A, an antenna module 10-3 including an end-fire antenna 100g, a patch antenna pattern 1110g, and an insulating layer 1140g may be disposed adjacent to a side boundary of an electronic device 700g and on a set substrate 600g of the electronic device 700g.

The electronic device 700g may be a smartphone, a personal digital assistant, a digital video camera, a digital still camera, a network system, a computer, a monitor, a tablet, a laptop, a netbook, a television, a video game, a smart watch, an automotive, or the like, but is not limited to the foregoing examples.

A communications module, or communications processor, 610g and a baseband circuit 620g may be further disposed on the set substrate 600g. The antenna module 10-3 may be electrically connected to a communications module 610g and/or a baseband circuit 620g through a coaxial cable 630g.

The communications module 610g may include at least a portion of a memory chip, such as a volatile memory (e.g., a DRAM), a non-volatile memory (e.g., a ROM), a flash memory, and the like; an application processor chip, such as a central processing unit (e.g., a CPU), a graphics processing unit (e.g., a GPU), a digital signal processor, a cryptographic processor, a microprocessor, a microcontroller, and the like; a logic chip, such as an analog-to-digital converter, an application-specific IC (ASIC), and the like, to perform a digital signal process.

The baseband circuit 620g may perform an analog-to-digital conversion, amplification in response to an analog signal, filtering, and frequency conversion to generate a base signal. The base signal input/output from the baseband circuit 620g may be transferred to the antenna module 10-3 through a cable.

For example, the base signal may be transferred to the IC through an electrical connection structure, a core via, and a wiring. The IC may convert the base signal into an RF signal in a millimeter wave (mmWave) band.

Referring to FIG. 8B, antenna modules 10-4 each including an end-fire antenna 100h, a patch antenna pattern 1110h, and an insulating layer 1140h may be disposed adjacent to a boundary of one side surface and a boundary of the other side surface of an electronic device 700h on a set substrate 600h of the electronic device 700h. A communications module, or communications processor, 610h and a baseband circuit 620h may be further disposed on the set substrate 600h. The antenna modules 10-4 may be electrically connected to the communications module 610h and/or the baseband circuit 620h through a coaxial cable 630h.

The patch antenna pattern, the coupling patch pattern, the conductive ring pattern, the conductive porous plate pattern, the feed via, the wiring via, the chain via, the grounding via, the shield via, the ground layer, the end-fire antenna pattern, the director pattern, the coupling ground pattern, and the electrical connection structure may be formed of a metallic material (e.g., a conductive material, such as copper (Cu), aluminum (Al), silver (Ag), tin (Sn), gold (Au), nickel (Ni), lead (Pb), titanium (Ti), an alloy of copper (Cu), aluminum (Al), silver (Ag), tin (Sn), gold (Au), nickel (Ni), lead (Pb), or titanium (Ti), and the like), and may be formed according to plating methods such as a chemical vapor deposition (CVD), a physical vapor deposition (PVD), a sputtering, a subtractive, an additive, a semi-additive process (SAP), a modified semi-additive process (MSAP), and the like, but is not limited to the foregoing examples.

The insulating layer disclosed in the present specification may be implemented with a thermosetting resin such as FR4, liquid crystal polymer (LCP), low temperature co-fired ceramic (LTCC), epoxy resin, or a thermoplastic resin such as polyimide, or a resin impregnated into core materials such as glass fiber, glass cloth and glass fabric together with inorganic filler, prepregs, Ajinomoto build-up film (ABF), FR-4, bismaleimide triazine (BT), photosensitive insulation imagable dielectric (PID) resin, a copper clad laminate (CCL), a glass or ceramic based insulating material, or the like. The insulating layer may be filled in at least a portion of a position on which a patch antenna pattern, a coupling patch pattern, a conductive ring pattern, a conductive porous plate pattern, a feed via, a wiring via, an end-fire antenna, a director pattern, the coupling ground pattern, and a electrical connection structure are not disposed, in the antenna apparatus and the antenna module as disclosed herein.

The RF signals disclosed in this specification may have a format according to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated as the later thereof, but are not limited to these examples.

An antenna apparatus and an antenna module according to embodiments disclosed herein may further concentrate the RF signal in the Z direction even without substantially increasing the size of a conventional antenna apparatus and a conventional antenna module, such that the antenna performance may be further improved.

An antenna apparatus and an antenna module according to embodiments disclosed herein may reduce the leakage phenomenon of the RF signal to the adjacent antenna apparatus, thereby improving the electromagnetic isolation of the adjacent antenna apparatus, or may have a reduced size in comparison to a conventional antenna apparatus and a conventional antenna module by omitting separate components for electromagnetic shielding.

The communications module 610g in FIG. 8A and the communications module 610h in FIG. 8B that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna apparatus, comprising:
conductive ring patterns disposed to be vertically separated from each other and disposed to form a first cavity;
chain via groups alternately disposed between the conductive ring patterns; and
a patch antenna pattern disposed to overlap with at least a portion of the first cavity in a vertical direction,
wherein a first top area of the first cavity is greater than a first bottom area of the first cavity,
wherein each of the chain via groups comprises chain vias arranged to form a second cavity overlapping with the first cavity, and
wherein a difference between a second top area of the second cavity and a second bottom area of the second cavity is smaller than a difference between the first top area of the first cavity and the first bottom area of the first cavity.

2. The antenna apparatus according to claim 1, further comprising a ground layer disposed in a position vertically lower than a position of the patch antenna pattern.

3. The antenna apparatus according to claim 2, wherein a distance between the ground layer and a lowest conductive ring pattern of the conductive ring patterns is longer than each of distances between adjacent conductive ring patterns among the conductive ring patterns.

4. The antenna apparatus according to claim 3, further comprising a grounding via disposed to electrically connect the lowest conductive ring pattern and the ground layer to each other.

5. The antenna apparatus according to claim 4, wherein the grounding via comprises grounding vias, and
the grounding vias are disposed to form a third cavity.

6. The antenna apparatus according to claim 5, a third bottom area of the third cavity is greater than the first top area of the first cavity.

7. The antenna apparatus according to claim 6, wherein at least a portion of the chain vias is disposed to overlap with at least a portion of the grounding vias in a vertical direction.

8. The antenna apparatus according to claim 3, wherein a portion of chain vias of one of the chain via groups is disposed to overlap with a portion of chain vias of another one of the chain via groups in a vertical direction.

9. The antenna apparatus according to claim 2, further comprising a feed via electrically connected to the patch antenna pattern and disposed to penetrate the ground layer.

10. The antenna apparatus according to claim 9, wherein the feed via comprises feed vias,
wherein a first feed via of the feed vias is disposed to be biased toward a first lateral direction from one position of the patch antenna pattern, and
wherein a second feed via of the feed vias is disposed to be biased toward a second lateral direction from the one position of the patch antenna pattern.

11. The antenna apparatus according to claim 10, wherein the patch antenna pattern has slits disposed in at least one of edges of the patch antenna pattern, and
wherein each of the feed vias is electrically connected to respective positions between pairs of the slits.

12. The antenna apparatus according to claim 1, wherein an area of the patch antenna pattern is greater than the difference between the first top area of the first cavity and the first bottom area of the first cavity.

13. The antenna apparatus according to claim 12, further comprising a coupling patch pattern disposed in a position vertically higher than the position of the patch antenna pattern,
wherein an area of the coupling patch pattern is greater than the area of the patch antenna pattern.

14. An antenna module, comprising:
conductive porous plate patterns disposed to be vertically separated from each other and disposed to form first cavities;
chain via groups alternately disposed between the conductive porous plate patterns; and
patch antenna patterns disposed to overlap with at least a portion of the first cavities in a vertical direction,
wherein a first top total area of the first cavities is greater than a first bottom total area of the first cavities,
wherein each of the chain via groups comprises chain vias arranged to form second cavities overlapping with the first cavities, and
wherein a difference between a second top total area of the second cavities and a second bottom total area of the second cavities is smaller than a difference between the first top total area of the first cavities and the first bottom total area of the first cavities.

15. The antenna module according to claim 14, further comprising a ground layer disposed in a position vertically lower than a position of the patch antenna patterns.

16. The antenna module according to claim 15, wherein a distance between the ground layer and a lowest conductive porous plate pattern of the conductive porous plate patterns is longer than each of distances between adjacent conductive porous plate patterns among the conductive porous plate patterns.

17. The antenna module according to claim 16, further comprising grounding vias disposed to electrically connect the lowest conductive porous plate pattern and the ground layer to each other,
wherein the grounding vias are disposed to form a third cavity.

18. The antenna module according to claim 15, further comprising feed vias electrically connected to the patch antenna patterns and disposed to penetrate the ground layer.

19. The antenna module according to claim 14, wherein each of the patch antenna patterns has edges and slits disposed in at least one of the edges.

20. The antenna module according to claim 14, wherein a total area of the patch antenna patterns is greater than the difference between the first top total area of the first cavities and the first bottom total area of the first cavities.

* * * * *